United States Patent [19]

Rogers

[11] Patent Number: 5,600,272
[45] Date of Patent: Feb. 4, 1997

[54] DIGITAL DAMPING METHOD AND APPARATUS FOR PHASE-LOCKED LOOPS

[75] Inventor: Alan C. Rogers, Palo Alto, Calif.

[73] Assignee: Sun Microsystems, Inc., Mountain View, Calif.

[21] Appl. No.: 582,048

[22] Filed: Jan. 2, 1996

Related U.S. Application Data

[63] Continuation of Ser. No. 254,270, Jun. 6, 1994, abandoned, which is a continuation-in-part of Ser. No. 119,874, Sep. 10, 1993, Pat. No. 5,371,425.

[51] Int. Cl.$^6$ ..................................................... H03L 7/00
[52] U.S. Cl. .................... 327/157; 327/156; 327/3; 327/147; 327/148; 327/40; 327/113; 327/103; 327/237; 331/10; 331/17
[58] Field of Search ................................. 331/14, 17, 10, 331/DIG. 2; 327/156, 165, 147, 148, 149, 153, 157, 158, 161, 236, 244, 5, 7, 3, 103, 237; 375/373, 374, 376

[56] References Cited

U.S. PATENT DOCUMENTS

| | | | |
|---|---|---|---|
| 5,012,494 | 4/1991 | Lai et al. | 331/17 |
| 5,126,692 | 6/1992 | Shearer et al. | 331/17 |
| 5,144,156 | 9/1992 | Kawasaki | 327/157 |
| 5,165,054 | 11/1992 | Platt et al. | 330/277 |

*Primary Examiner*—Timothy P. Callahan
*Assistant Examiner*—Dinh T. Le
*Attorney, Agent, or Firm*—Blakely Sokoloff Taylor & Zafman LLP

[57] ABSTRACT

A damping circuit is described which includes a phase-and-frequency detector, a charge pump, a voltage-current oscillator and a capacitor. The phase-and-frequency detector generates UP and DOWN signals representative of a difference in phase between a pair of digital input signals. The charge pump varies an amount of charge carried within the capacitor in accordance with the UP and DOWN signals. The voltage controlled oscillator generates an output signal having a frequency controlled by both a voltage provided by the capacitor and by the UP and DOWN signals directly received from the phase-and-frequency detector. No analog damping resistor is required. Rather, the damping circuit is an digital circuit which generates adequate phase and frequency damping without a damping resistor. Damping is achieved which is substantially unaffected by process parameters and operating and ambient parameters. Method embodiments of the invention are also described.

24 Claims, 6 Drawing Sheets

DIGITAL DAMPING METHOD AND APPARATUS FOR PHASE-LOCKED LOOPS

RELATED APPLICATIONS

This is a continuation of application Ser. No. 08/254,270, filed Jun 6, 1994, now abandoned, which is a continuation-in-part of U.S. patent application Ser. No. 08/119,874 entitled Digital Damping Method and Apparatus for Phase-locked Loops, filed Sep. 10, 1993 and issued on Dec. 6, 1994, as U.S. Pat. No. 5,371,425.

BACKGROUND OF THE INVENTION

FIELD OF THE INVENTION

The invention generally relates to phase-locked loops (PLL) and in particular to digital phase-locked loops for use in connection with integrated circuits such as microprocessors.

DESCRIPTION OF RELATED ART

Digital PLL's are being increasingly employed in connection with microprocessor chips, in particular for maintaining and regenerating a clock signal used by the microprocessor chip. Initially, such PLL's were fabricated with components separate from the microprocessor chip, with appropriate interconnection circuitry provided for operably connecting the off-chip PLL components to the microprocessor chip. Although an off-chip configuration has been successful for relatively low frequency microprocessor chips, such a configuration is not particularly effective for high frequency microprocessor chips, in part due to noise occurring during transmission of signals between the microprocessor chip and the off-chip PLL components. Furthermore, a PLL having off-chip components incurs additional costs resulting from the fabrication and assembly of the off-chip components, as well as the provision of an extra pin for allowing communication between the microprocessor chip and the off-chip PLL components.

Accordingly, it is desirable to provide a complete PLL directly on a microprocessor chip, whereby the noise problem and extra costs described above are largely eliminated. FIG. 1 illustrates a portion of a PLL circuit appropriate for integrating within a microprocessor chip. For clarity and brevity the microprocessor chip itself is not illustrated in FIG. 1.

PLL circuit 10 of FIG. 1 includes a phase-and-frequency detector 12, a charge pump 14, a voltage controlled oscillator (VCO) 16, a resistor 18 and a capacitor 20. Phase-and-frequency detector 12 receives a reference frequency, generally a square wave, on input line 22, and a feedback signal on line 24, also generally a square wave. The feedback signal is derived from the output frequency on line 36 typically divided down in frequency by an integer N so that the output of the VCO 16 is a frequency N times the referency frequency on line 22. Phase-and-frequency detector 12 generates signals representative of phase or timing differences between the feedback signal and the reference signal. If the feedback signal has a transition occuring later than the corresponding transition of the reference signal, phase-and-frequency detector 12 provides an UP signal on line 26 which has a duration representative of the amount of phase difference between the reference signal and that of the feedback signal. More specifically, the UP signal is a pulse of fixed amplitude having a length proportional to the phase difference between the feedback signal and the reference signal. If the feedback signal has a transition occuring earlier than that of the reference signal, phase-and-frequency detector 12 provides a DOWN signal on output line 28, also representative of the amount by which the phase of the feedback signal differs from that of the reference signal. As with the UP signal, the DOWN signal is a signal pulse having a fixed amplitude and a length proportional to the phase difference between the feedback signal and the reference signal.

Charge pump 14 responds to each UP and DOWN signal on lines 26 and 28, respectively, by providing a charge increment to node 30 proportional to the duration of a respective UP signal, or alternatively to remove a charge increment from line 30 in proportion to the duration of a respective DOWN signal. Each such charge increment is a fixed magnitude of current for a time dependent on the duration of the UP or DOWN signal. These current pulses into or out of node 30 are current pulses through resistor 18, providing voltage pulses there across, with the total change in charge on node 30 being integrated with time by capacitor 20. Thus the voltage across capacitor 20 at any time is equal to the total time integral of the charge to and from node 30 divided by the capacitance of the capacitor, and the voltage increment across the resistor, averaged over a cycle of the reference frequency, is proportional to the rate of change of voltage on the capacitor. The voltage on node 30 is converted to a current proportional to the voltage by the voltage to current converter 32 and then to an output frequency on line 36 by the current controlled oscillator 34.

In general, the frequency response of the loop including the circuit of FIG. 1 and the feedback of the output frequency on line 36 to line 24, typically after dividing the same DOWN as previously mentioned, is normally much lower than the output frequency itself on line 36 or the reference frequency on line 22. Accordingly, the closed loop may be approximated by a linear circuit, which, when analyzed for the output frequency as a function of the reference frequency, shows that the loop acts as a second order system. Further, the natural frequency of the second order system is dependent on, among other parameters, the value of capacitor 20, and the damping of the second order system is dependent upon the value of resistor 18. Thus, the value of capacitor 20 is chosen to provide the desired time response of the phased lock loop to frequency perturbations, and the value of resistor 18 is chosen to provide the desired damping of that time response.

The PLL circuit of FIG. 1 is fabricated according to conventional complementary metal oxide semiconductor (CMOS) technology. Hence, the size of capacitor 20 is restricted due to the limitations of CMOS capacitor fabrication. Because of the restriction in the size of the capacitor, the frequency response of the PLL illustrated in FIG. 1 is relatively high, requiring extremely high resistance values for damping resistor 18. As noted above, the damping resistor 18 operates to both damp the frequency lock and control the gain of the overall phase lock. As a result, mutually exclusive demands are imposed on the resistance value of resistor 18. The resistance value should be large to properly damp the frequency lock but must be relatively small to properly damp the phase lock. As can be appreciated, compromises must be made to accommodate the conflicting demands upon the resistor, resulting in a damping resistor which is only marginally effective in damping both the frequency lock and the phase lock.

Moreover, in most fabrication processes for fabricating a damping resistor on a microprocessor chip, the resistor is fabricated out of MOS transistors such that the resistance value of the resistor varies according to process and operating conditions. Hence, the resistance value cannot be precisely and repeatable defined. Furthermore, the phase gain of the PLL varies with operating frequency and conditions. As a result of these various restrictions and other factors, a typical on-chip PLL, such as illustrated in FIG. 1, provides inadequate damping for frequency lock. Further, the amount by which the PLL is under-damped varies from chip-to-chip as a result of processing and operating conditions. The various disadvantages are more significant for microprocessor chips operating at high frequencies.

SUMMARY OF THE INVENTION

In accordance with one aspect of the invention, an improved damping circuit is provided which includes a phase detector for receiving first and second input signals and for generating first and second comparison output signals representative of differences between phases of the first and second input signals. An integrator is provided for summing the first and second comparison signals. A voltage-to-current converter generates an output current responsive to the amount of voltage provided by the integrator and further responsive to the first and second comparison signals provided by the phase detector, the sum or integral of which is the voltage of the integrator. A current-controlled oscillator, connected to the voltage-to-current converter generates a signal having a frequency representative of the output current of the voltage-to-current converter.

With one embodiment, the integrator includes a capacitor for storing a charge and a charge pump, connected to the phase detector and the capacitor, for varying an amount of charge stored on the capacitor by an amount proportional to signals received from the phase detector. The voltage on the capacitor is coupled to a voltage to current converter which in turn outputs a current component proportional thereto to control a current controlled oscillator. The voltage to current converter also receives as inputs, the outputs of the phase detector, and outputs additional current components of appropriate sign and magnitude to provide additional current components to the current controlled oscillator similar to the components that would have resulted if instead a resistor had been used as in the prior art and the voltage there across included with the voltage across the capacitor as the input to the voltage to current converter.

Partially as a result of the elimination of the damping resistor, the limitations and restrictions described above with reference to the prior art are avoided and adequate frequency-lock damping is achieved regardless of variations in process and operating conditions. In particular, a PLL constructed in accordance with the invention automatically adjusts the phasegain of the PLL damping function to the particular operating conditions and to the frequency of the PLL. Moreover, the improved PLL circuit provides improved damping for frequency lock in a manner substantially unaffected by process variations. The PLL damping circuit does not rely on, and is not be affected by, analog qualities of individual analog components.

The damping circuit may be employed in a PLL or other circuitry such as a delay lock loop (DLL). The digital damping circuit is ideally suited for use as an on-chip circuit for a microprocessor. However, the damping circuit may be employed in a variety of PLL applications including cellular telephones, car radios and metal detectors. In general, whenever a PLL is integrated onto a silicon chip, whether for low-cost or high-performance reasons, the PLL can benefit from application of the principles of the invention. The invention is also applicable to non-PLL applications, such as DLL's and the like and may also be applicable to non-digital applications.

DETAILED DESCRIPTION OF THE INVENTION

Figure 2:
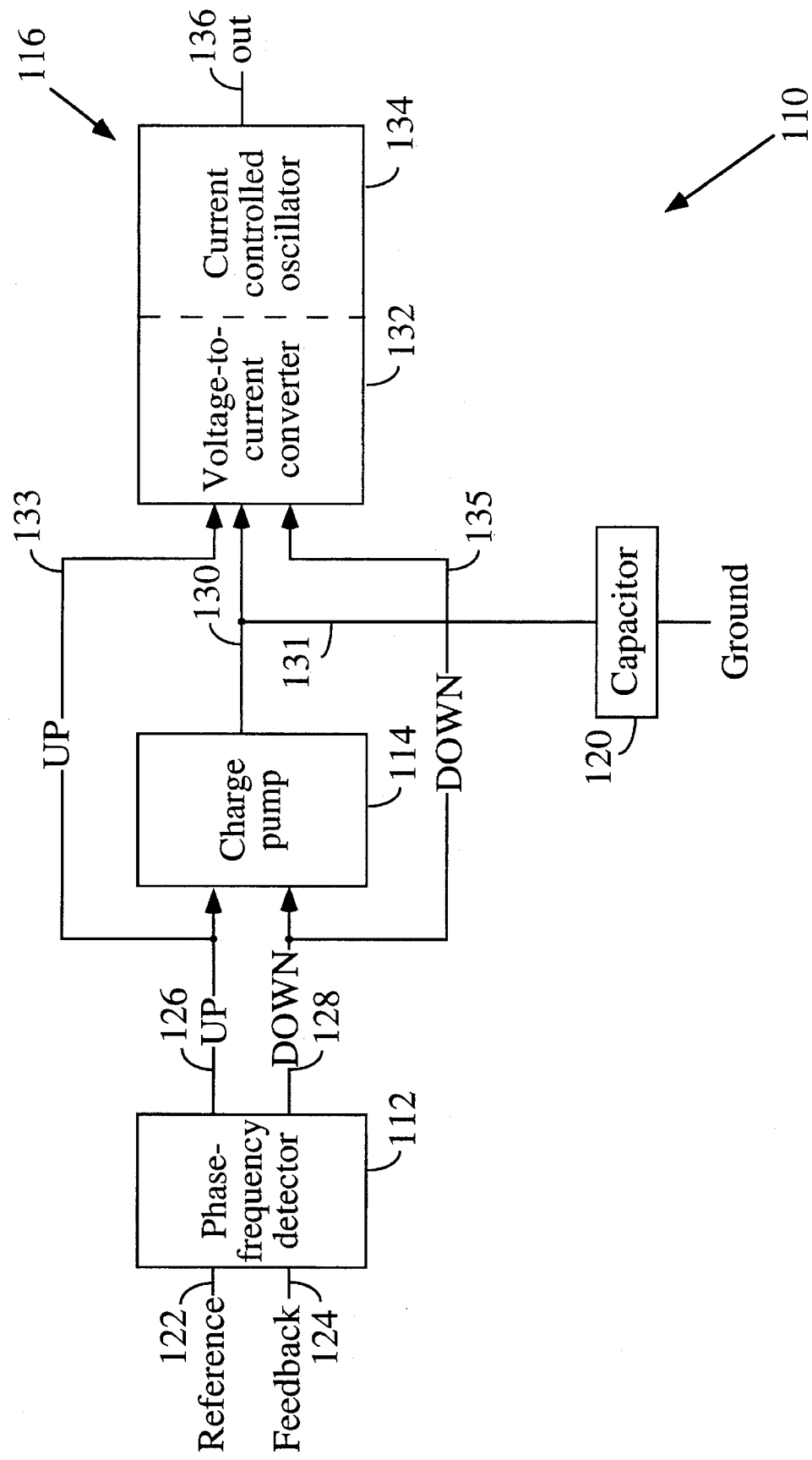
FIG. 2 provides a block diagram illustrating a digital PLL damping circuit configured in accordance with a preferred embodiment of the invention.
Figure 3:
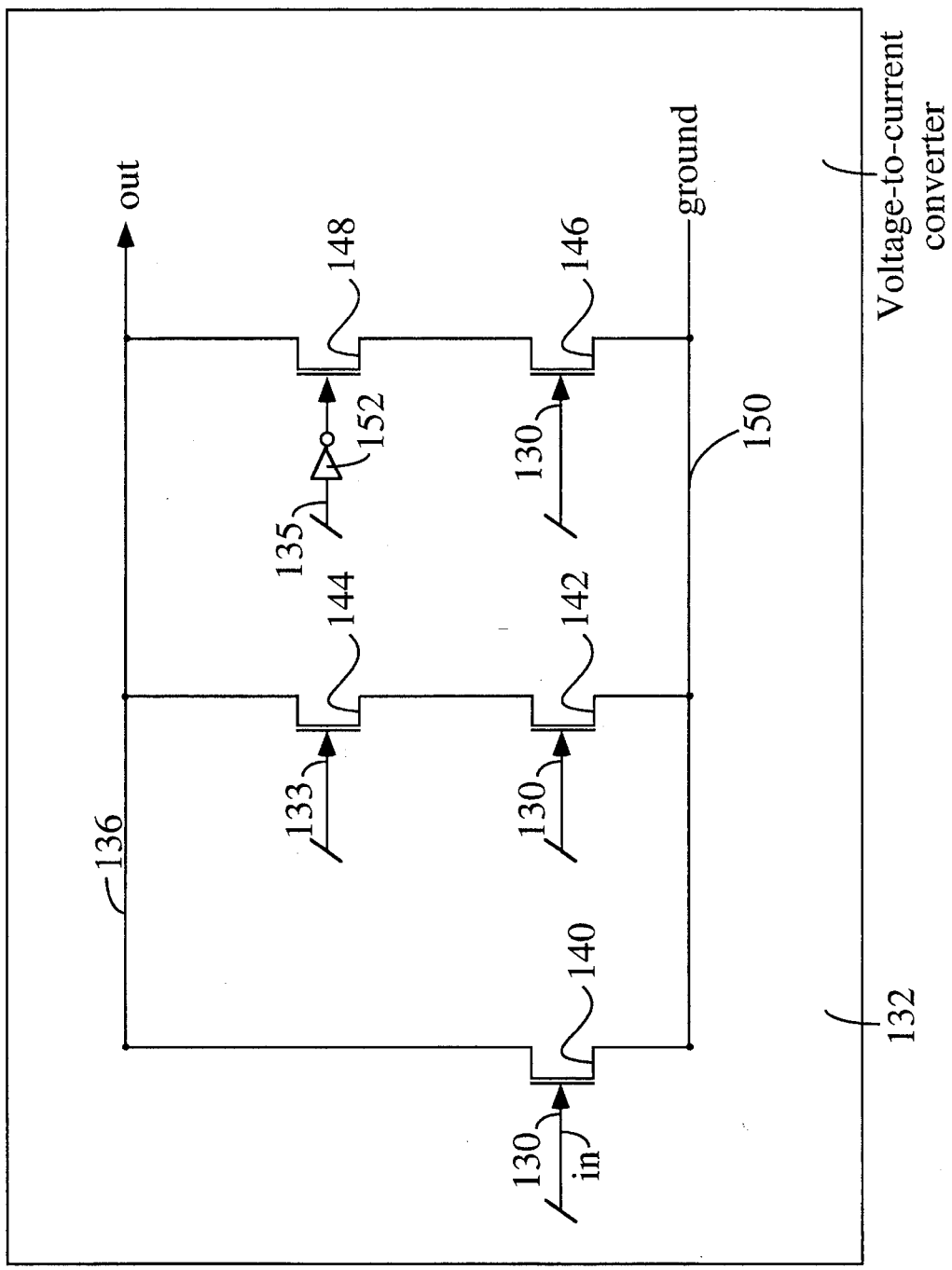
FIG. 3 provides a schematic illustration of a voltage-to-current circuit of the PLL damping circuit of FIG. 2.
Figure 4:
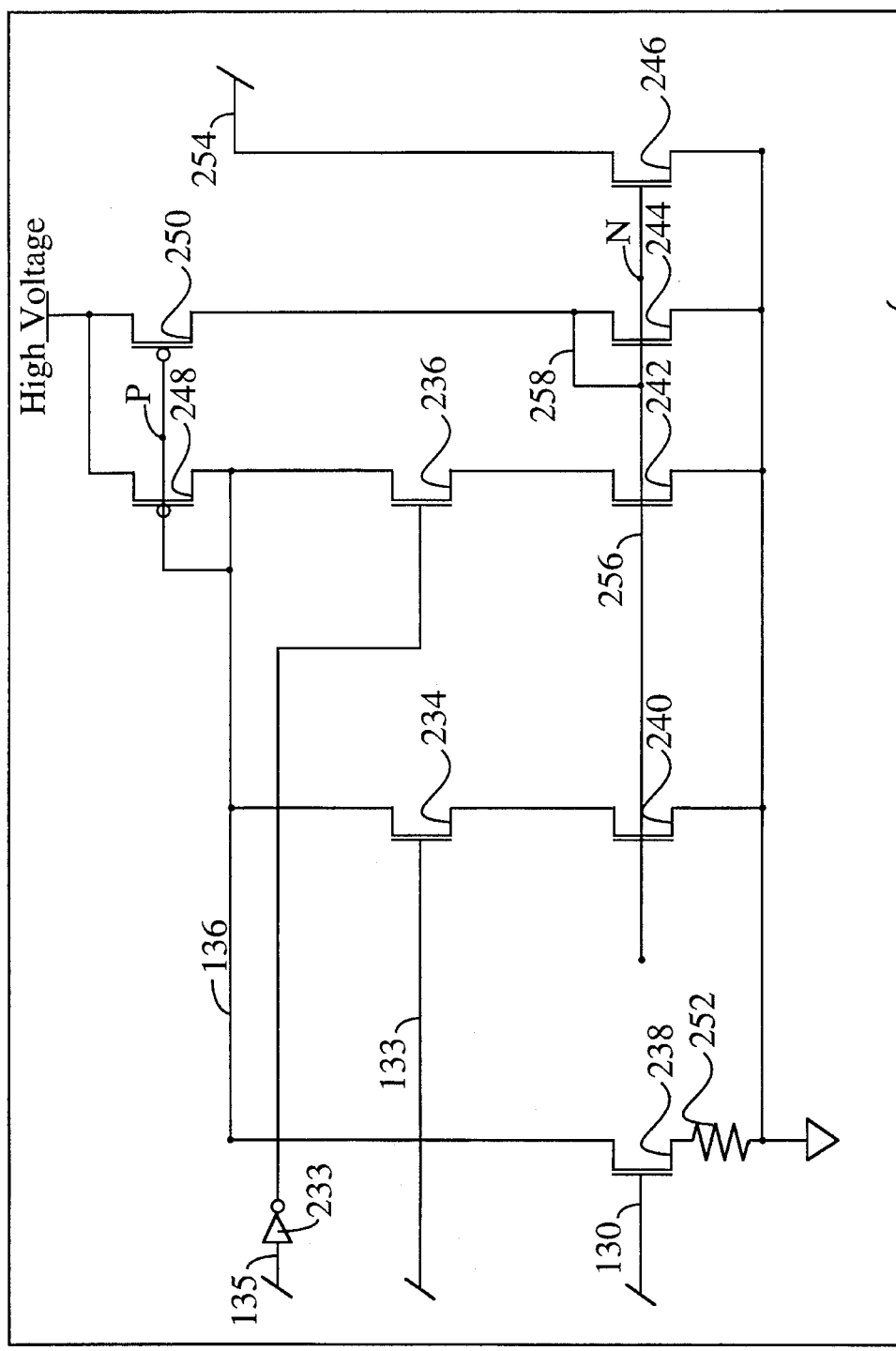
FIG. 4 provides a schematic illustration of an alternative embodiment of the voltage-to-current circuit of FIG. 3.

Referring to FIGS. 2 through 4, several embodiments of the invention will now be described. FIG. 2 illustrates a damping PLL circuit 110 for use as part of an integrated circuit, such as a microprocessor. In the exemplary embodiment shown, other components of the microprocessor chip are not shown in FIG. 2. Digital damping PLL circuit 110 includes a phase-and-frequency detector 112, a charge pump 114, a VCO 116 and a capacitor 120. Phase-and-frequency detector 112 receives a reference signal on input line 122 and a feedback signal on input line 124, which may be the oscillator output on line 136 or, in many applications, the output on line 136 after the same has been divided down to a lower frequency. The phase-and-frequency detector 112 is a circuit which generates output comparison signals representative of differences between the phase or timing of the feedback signal and the reference signal, typically derived from an off chip crystal. In particular, phase-and-frequency detector 112 generates an UP signal output on line 126 and a DOWN signal output on line 128. More specifically, the UP signal is a pulse of fixed amplitude having a length proportional to the amount by which the phase of the feedback signal is later or less that of the reference signal. The DOWN signal is a pulse of fixed amplitude having a length proportional to the amount by which the phase of the feedback signal is earlier than or leads that of the reference signal.

Figure 1:
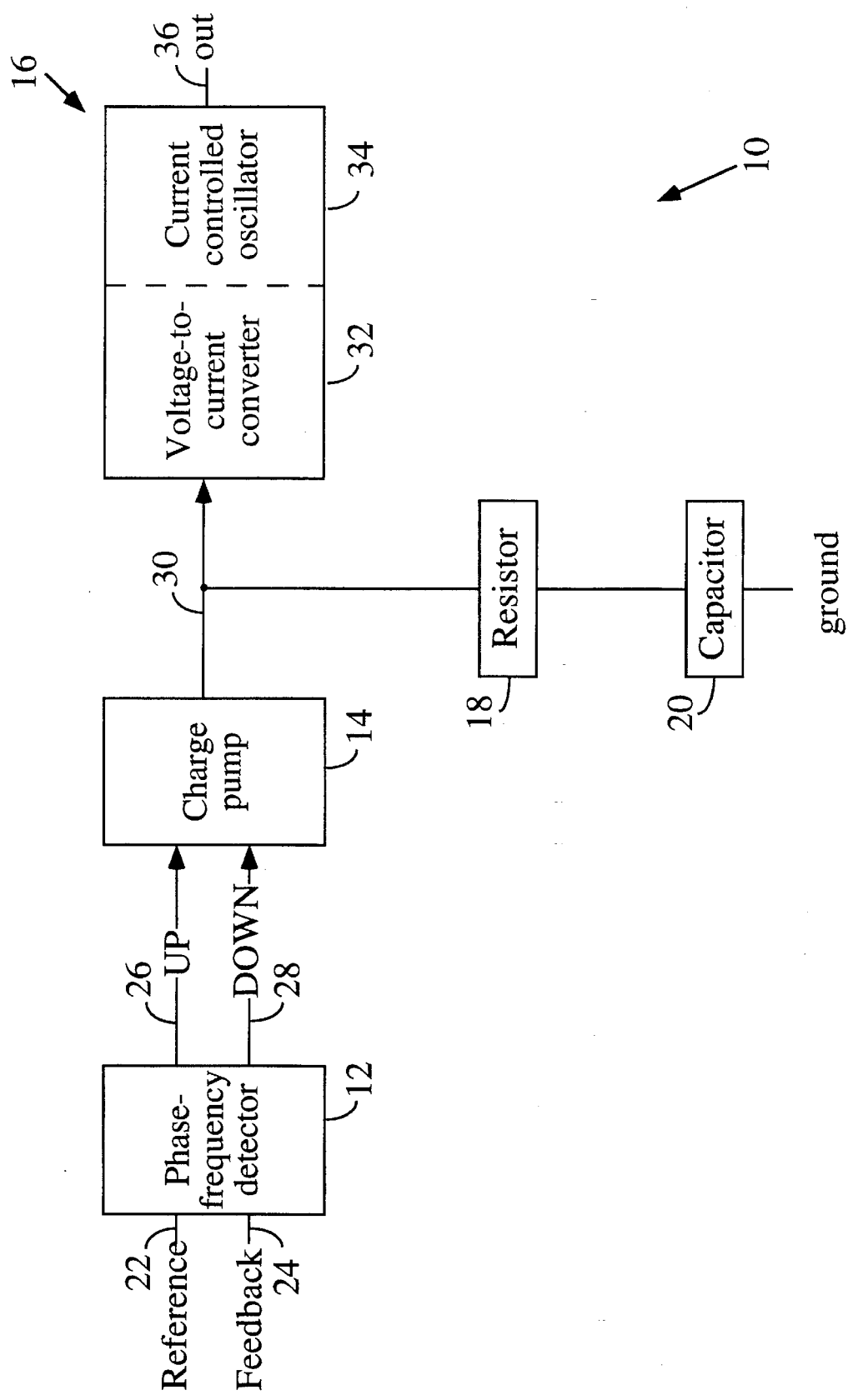
FIG. 1 is a block diagram representation of a prior art PLL damping circuit.

Charge pump 114 is a charge pump circuit which varies the charge stored on capacitor 120 in response to the UP and DOWN signals received from phase-and-frequency detector 112 on lines 126 and 128, respectively. Charge pump 114 operates to increase the amount of charge held by capacitor 120 if an UP signal is received and operates to decrease the amount of charge on capacitor 120 if a DOWN signal is received. As in FIG. 1, the amount by which the charge is varied depends upon the length of the UP and DOWN signals. As can be seen from a comparison of FIG. 1 and FIG. 2, the PLL digital damping circuit of FIG. 2 does not include a damping resistor such as the one illustrated in FIG. 1.

Together, charge pump 114 and capacitor 120 provide an integration or summation elements for the signed summing of the outputs of phase-and-frequency detector 112 and for generating a voltage representative of that summation. Although the combination of a charge pump and a capacitor represents a preferred embodiment of the integrator, other integration or summation elements may alternatively be employed. In general, any of a wide variety of devices which can sum the output signals of phase-and-frequency detector 112 and generate a voltage in response thereto can be employed. One specific example of an alternative integrator is a digital integrator which employs a counter mechanism, an example of which is described in U.S. Pat. No. 5,220,293 to Rogers, which disclosure is incorporated herein by reference.

VCO 116 includes a voltage-to-current circuit 132 and a current-controlled oscillator 134. Voltage-to-current circuit 132 receives a signal along line 130 having a voltage controlled by the amount of charge within capacitor 120. Voltage-to-current circuit 132 also receives the UP and DOWN signals on lines 133 and 135, respectively, with line 133 providing a direct connection to line 126 and line 135 providing a direct connection to line 128. Thus, unlike the VCO of the PLL damping circuit of FIG. 1 which receives only a single input, voltage-to-current circuit 132 receives three input signals. Voltage-to-current circuit 132 generates a current output signal which is responsive to both the voltage received on line 130 and any UP or DOWN pulse received on lines 133 and 135, respectively. Current-controlled oscillator 134 generates an output signal having a frequency proportional to the current signal output from voltage-to-current circuit 132. The output signal provided by current-controlled oscillator 134 on line 136 is connected to other components (not shown) on the chip. In particular, the output signal may be used to regenerate a clock signal for controlling operation of the various components of the chip. The components of the chip include a path through which the output signal is ultimately fed back onto input line 124, thereby providing a complete feedback loop. Hence, the components illustrated in FIG. 2, in combination with the feedback loop (not shown), together comprise a complete PLL circuit.

FIG. 3 illustrates the detailed circuit diagram of the voltage-to-current converter 132. The voltage to current converter 132 of FIG. 3 is driven through a current mirror which mirrors the current the circuit draws from line 136 to the output (the circuit of FIG. 4, yet to be described in detail, shows one such suitable current mirror supply-output circuit). The voltage on capacitor 120 (FIG. 2) is applied through line 130 to the gates of n-MOS transistors 140, 142 and 146. The voltage on line 130 sets the gate to source voltage of n-MOS transistor 140 so that the same will conduct a current proportional to the amount the gate voltage exceeds the threshold voltage of the device. n-MOS transistors 142 and 146 will also conduct a current proportional to the amount which the input voltage on line 130 exceeds the threshold voltage of the devices, subject however to whether the switching n-MOS devices 144 and 148 are on or off. Also, devices 142 and 146 are specifically made smaller in channel width than device 140 so that the same will have similar characteristics to device 140, but will conduct only a fraction of the current of device 140 when biased with the same gate to source voltage as device 140. This sizing, which may vary depending on the phase look loop parameters, is to provide the desired damping of the phase lock loop of the exemplary embodiment, as the current components of devices 142 and 146 provide the desired damping functionally corresponding to the voltage drop across resistor 18 of FIG. 1 during the UP pulses and the DOWN pulses, respectively.

As previously stated, n-MOS transistors 144 and 148 are used as switching devices, device 142 only being able to conduct a current component when device 144 is on, and similarly device 142 only being able to conduct a current component when device 148 is on.

Assume for the moment that the phase-frequency detector 112 senses no phase error between the reference frequency on line 122 and the feedback frequency on line 124 (FIG. 2) so that there is neither an UP signal nor a DOWN signal active. The voltage on line 130 turns n-MOS transistor 140 partially on to provide a first component of current there through responsive to the voltage on the capacitor. Both the UP signal on line 133 and the DOWN signal on line 135 will be low under these conditions, turning off n-MOS transistor 144 because of the low gate voltage thereon, though turning on n-MOS transistor 148 because of the inversion of the low voltage on line 135 by inverter 152 coupled to the gate of n-MOS transistor 148. Accordingly, in addition to the current component through n-MOS transistor 140, there will be a current component through transistor 146 proportional to the component through transistor 140 (though smaller because of the relative transistor sizes in the preferred embodiment). Consequently, the circuit of FIG. 3 under the zero phase error condition will draw a current $I_{140}+I_{146}$.

If the phase of the feedback on line 124 starts drifting ahead of the phase of the reference on line 122, then the DOWN signal 128 will start to pulse with a pulse duration proportional to the phase error. Each pulse of the DOWN signal represents a positive pulse on line 135 which, when inverted by inverter 152, pulses n-MOS transistor 148 off, thereby decreasing the current through the circuit of FIG. 3 and thus the current mirrored to the output. Similarly, if the phase of the feedback starts lagging the phase of the reference, the UP signal will start to pulse, with each pulse having a duration proportional to the phase error. This pulses n-MOS transistor 144 on, thereby allowing n-MOS transistor 142 to conduct a current component during the pulses, increasing the current through the circuit and thus increasing the current mirrored to the output to increase the output frequency on line 136 accordingly. Thus, while the nominal current through the circuit is equal to $I_{140}+I_{146}$, in limit of a continuous DOWN signal, the current would be $I_{140}$, and in the limit of a continuous UP signal the current would be $I_{140}+I_{142}+I_{146}$.

Referring again to FIG. 1, each UP and each DOWN pulse of current through resistor 18 of the prior art will provide a component of current for the duration of the respective pulse which is independent of the voltage on capacitor 20, so that the resulting pulse voltages across resistor 18 applied to the voltage to current converter 32 are also independent of the voltage on capacitor 20. In comparison, however, in the circuit of FIG. 3, each UP pulse on line 133 provides a component of current for a duration equal to the duration of the UP pulse, but of a current magnitude which is proportional to the then present current component through n-MOS transistor 140. This is of little consequence however, as the current component through n-MOS transistor 140 for a phase lock loop in locked condition will not vary substantially from its nominal operating value, so that the corresponding current components through n-MOS transistors 142 and 146 will be substantially constant at the desired operating point during normal operation. In essence, referring to FIG. 1, what would have been an IR drop across resistor 18 and converted to a current by voltage to current converter 32 for control of the current controlled oscillator in the prior art is instead, referring to FIG. 3, directly converted to damping current components for control of the current controlled oscillator by the new voltage to current converter 132.

n-MOS transistors 144 and 148 should preferably be equal to or larger than each of transistors 142 and 146. Transistors 142 and 146 are preferably, but not necessarily, of equal size for symmetry of response. Preferably, transistors 140 and 146 together are equal in size to the n-MOS transistor of a conventional voltage-to-current circuit, wherein only a single n-MOS transistor is provided, as the nominal operating current is $I_{140}+I_{146}$. Otherwise, the size of the various transistors illustrated in FIG. 3 may be selected in accordance with well established circuitry considerations to provide an output current having the desired relationship with the input values.

As will be appreciated by those skilled in the art, if transistors 142 and 146 have only ten percent of the gain of the combination of transistors 140 and 146, then the overall phase gain will be ten percent, regardless of process or ambient conditions, filter component values, loop gain, or operating frequency. Hence, the overall phase gain is unaffected by any of these various factors which, in general, substantially affect phase gain provided by the PLL damping circuit of FIG. 1 which includes an analog damping resistor. As such, adequate phase damping and adequate frequency damping are both achieved without the compromises necessitated by the configuration of FIG. 1.

Referring again to FIG. 2, the various components shown therein may be of substantially conventional design and fabrication other than voltage-to-current circuit 132. Of course, the particular design and fabrication, as well as the particular operational parameters, may be selected as needed, in accordance with well established circuit design principles, to achieve desired phase-locked loop parameters for use in particular applications.

Further, although a preferred embodiment of the invention employs n-MOS transistors to form voltage-to-current circuit 132, other general switching devices may be employed. For example, n-MOS transistors 144 and 148 illustrated in FIG. 3, may be any suitable type of switch, whereas n-MOS transistors 140, 142 and 146 may be any suitable type of voltage controlled current source. In general, VCO 116 may be implemented with a variety of alternative embodiments, including embodiments having resistor and bipolar and p-MOS components.

Referring to FIG. 4, an alternative embodiment to the voltage-to-current circuit is provided. In this embodiment, p-MOS transistors 248 and 250 are connected as a current mirror so that the current through p-MOS transistor 248 will be mirrored to p-MOS transistor 250 and thus flow through n-MOS transistor 244 also. This current in turn is mirrored by transistor 246, as a result of the connections of lines 258 and 256, to provide the current output on line 254 to the current control oscillator 134 of FIG. 2. In that regard, these four devices, namely p-MOS transistors 248 and 250 and n-MOS transistors 244 and 246, may be used to provide the current to line 136 and mirror that current to the output of the embodiment of FIG. 3, the same providing the current to line 136 and mirroring the same as the output current on line 254 in the embodiment of FIG. 4.

Referring again to FIG. 4, the voltage on capacitor 120 (FIG. 2) is provided on line 130 to the gate of transistor 238, the source thereof being coupled to ground through resistor 252 and the drain thereof being coupled to line 136. With this connection, the current component through n-MOS transistor 238 is proportional to the amount the voltage on line 130 exceeds the threshold voltage of the n-MOS transistor 238, the resistor 252 controllably reducing the effective transconductance of transistor 238. This component of current through transistor 238, dependent upon the voltage on the capacitor 120 (FIG. 2) is, of course, mirrored by p-MOS transistors 248 and 250 to n-MOS transistor 244, which mirrors the same not only to the output through n-MOS transistor 246, but also to n-MOS transistors 242 and 240 so that each of them may have a corresponding current component (subject again to transistor size considerations) whenever n-MOS transistors 234 or 236, respectively, are turned on.

As before, when there is no phase error and thus neither an UP or DOWN pulse, the voltages on lines 133 and 135 are low. The low voltage on line 133 holds device 234 off, though the low voltage on line 135, being inverted by inverter 233, holds n-MOS transistor 236 on. With n-MOS transistor 236 on, the current component through transistor 242 is mirrored through p-MOS transistors 248 and 250 back to n-MOS transistor 244, and then some portion thereof is mirrored back to transistor 242 in an amount dependent upon the relative sizes of n-MOS transistor 242 with n-MOS transistor 244. If by way of example, n-MOS transistor 242 has only one-fifth the gate width of n-MOS transistor 244 and thus only twenty percent of the current through n-MOS transistor 244 is mirrored to n-MOS transistor 242, then the holding on of device 236 will cause the current component through n-MOS transistor 242 to be mirrored to n-MOS transistor 244, twenty percent of which is re-mirrored to n-MOS transistor 242 which is again re-mirrored to n-MOS transistor 244, with twenty percent of the twenty percent being re-mirrored to n-MOS transistor 242, etc., so that the combination of the four transistors 248, 250, 242 and 244 connected as intercoupled current mirrors through transistor 236, when on, quickly converges to a stable operating point. (If, for instance, transistor 242 were larger than transistor 244, the loop formed by these transistors would have a gain greater than one and would be an unstable current loop because of the current gain provided in the mirroring from n-MOS transistor 244 to n-MOS transistor 242. However system parameters may readily be chosen so that the desired damping is achieved while maintaining the respective current loop gain well below unity.)

When an UP pulse is received on line 133, transistor 234 is pulsed on. Now the current component contributed by n-MOS transistor 240 is also mirrored by p-MOS transistors 248 and 250 to n-MOS transistor 244, a fraction of which is mirrored back to n-MOS transistors 240 and 242, somewhat increasing the current components through each of them. More specifically, if transistors 240 and 242 each have a gate width of twenty percent of the gate width of transistor 244, then 40 percent of the current from these transistors will be repeatedly remirrored, so that the effective contribution in output current component from these transistors will be somewhat higher than 40 percent. This is the worst case from a stability standpoint, however, and as long as the resulting current loop gain remains substantially less than one with transistors 232 and 236 both on, the circuit will be both stable and fast.

Exemplary sizes for the various transistors, provided as channel width/channel length ratios is set forth in Table I.

TABLE I

| | |
|---|---|
| n-MOS transistor 234 | 2/0.8 |
| n-MOS transistor 236 | 2/0.8 |
| n-MOS transistor 238 | 10/0.8 |
| n-MOS transistor 240 | 2/0.8 |
| n-MOS transistor 242 | 2/0.8 |
| n-MOS transistor 244 | 10/0.8 |
| n-MOS transistor 246 | 10/0.8 |
| p-MOS transistor 248 | 20/0.8 |
| p-MOS transistor 250 | 20/0.8 |

Although Table I provides a set of exemplary sizes for the various transistors for FIG. 4, other suitable choices for the sizes of the transistors may be selected in accordance with particular applications. As such, the values of Table I should be regarded as exemplary or illustrative.

The embodiment of the voltage-to-current circuit of FIG. 4 is particularly useful in a digital damping circuit wherein a resistor is employed for precise voltage-to-current conversion. As a practical matter, nodes P and N of FIG. 4 may be used as a current-mirror control for VCO 134 (FIG. 2). In such an implementation, transistor 246 and output line 254 are not required. Rather, outputs are drawn directly from the P and N nodes and transmitted by lines (not shown) to the VCO.

Figure 5:
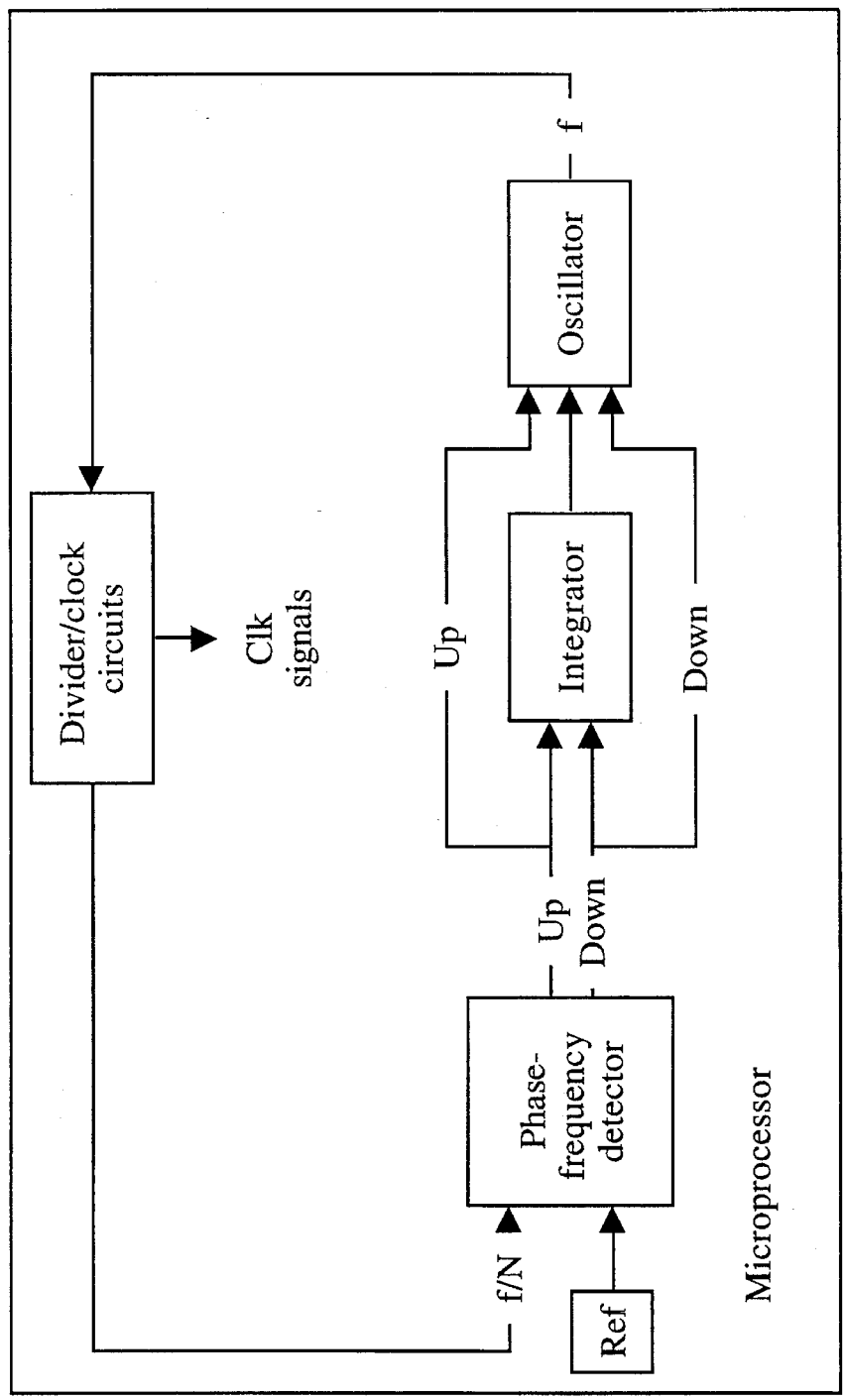
FIG. 5 illustrates a generalized implementation of the damping circuit of the present invention integrated into a phase locked loop of a microprocessor and providing one or more clock signals to the processor circuitry.
Figure 6:
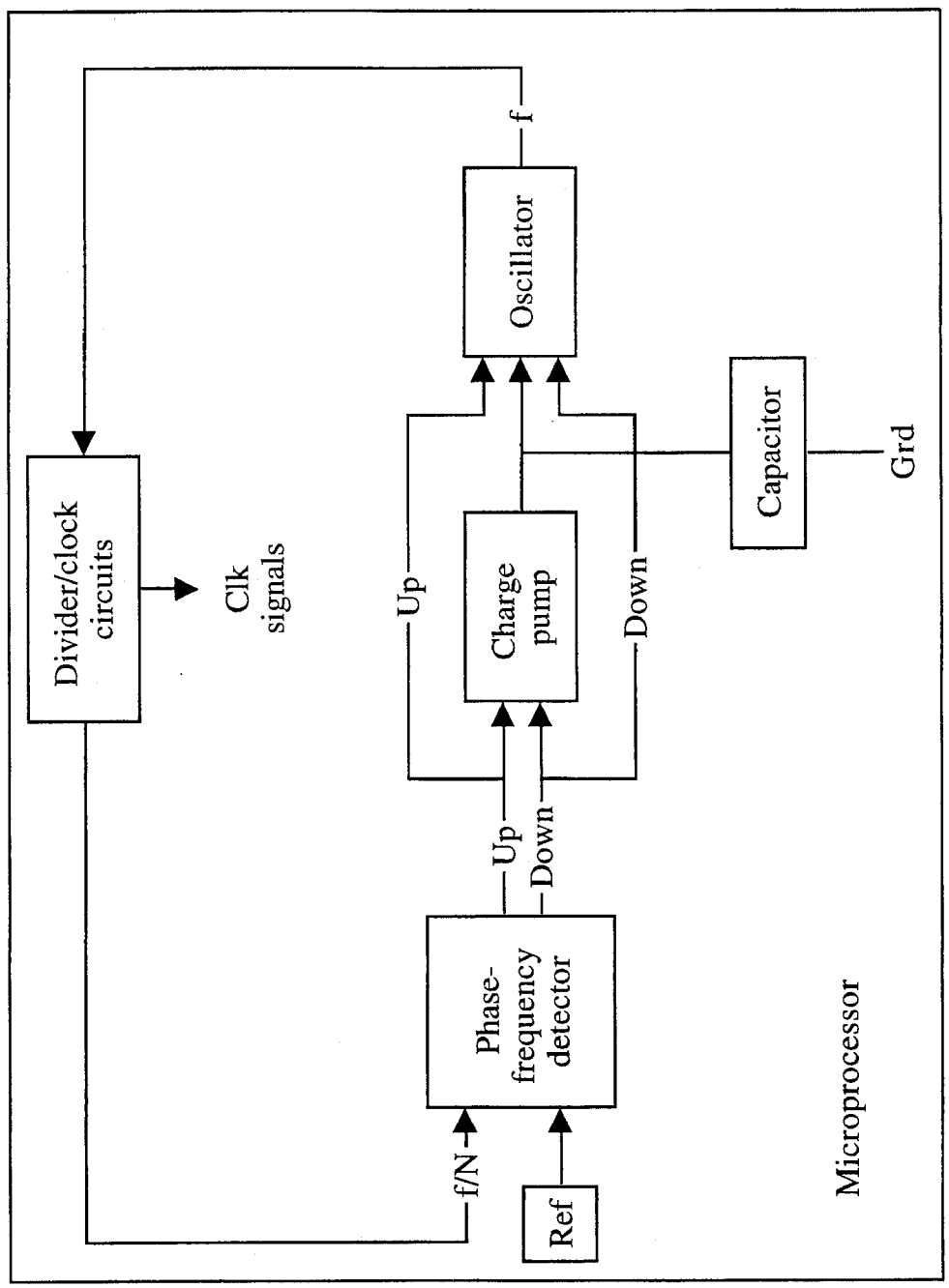
FIG. 6 illustrates a generalized implementation similar to the implementation of FIG. 5 wherein the integrator is specifically comprised of a charge pump and a capacitor.

FIG. 5 illustrates the present invention in the a general configuration as the same may be used on-chip in a phase locked loop of a microprocessor to provide one or more clock signals for the microprocessor. Here the phase-frequency detector provides the UP and DOWN signals to the oscillator and to the integrator, with the output of the integrator also being provided to the oscillator. The oscillator is responsive to all three signals, with the output of the oscillator (f) being provided to on-chip divider/clock circuits from which the clock signals CLK are derived as required for operation of the microprocessor. Typically the feedback signal f/N is the oscillator output (f) divided by N, where N is an integer which may be 1, but typically is a number substantially greater than one, so that the reference frequency Ref may be a sub harmonic of the oscillator frequency f. FIG. 6 is similar to FIG. 5, though specifically shows the integrator as being a charge pump and a capacitor, as in the preferred embodiment of the invention.

What has been described is a digital damping PLL method and apparatus which may be employed on or in conjunction with a microprocessor chip. Although the PLL damping circuit of the invention is advantageously employed as an on-chip component of any chip requiring a PLL, the advantages of the invention are best exploited within microprocessor chips having very high operational frequencies. As discussed above, one possible advantage of the improved method and apparatus is that adequate phase damping and frequency damping may be achieved regardless of various process, operational, and frequency parameters. However, application of principles of the invention are not solely limited to achieving these advantages, and other advantages may be achieved by exploiting principles of the invention.

Furthermore, although described with respect to exemplary embodiments, these embodiments are merely illustrative of the invention and do not limit the scope of the invention. In particular, principles of the invention may be applied to non-PLL applications, such as DLL's. In general, principles of the invention can be advantageously applied to a variety of applications requiring digital phase damping, and may be applicable to non-digital damping applications as well.

What is claimed is:

1. A damping circuit comprising:

a phase detector for receiving first and second input signals and for generating a first comparison signal representative of an amount by which a phase of the first input signal exceeds a phase of the second input signal and a second comparison signal representative of an amount by which the phase of the second input signal exceeds the phase of the first input signals, said first input signal being a reference signal and said second input signal being a feedback signal;

an integrator coupled to said phase detector for combining said first and second comparison signals and for generating a third comparison signal representative of a cumulative sum of said first and second comparison signals;

an oscillator coupled to said phase detector and said integrator for generating an output signal having a frequency responsive to the combination of said first, second and third comparison signals, said output signal being coupled to provide said feedback signal.

2. The damping circuit of claim 1 wherein said oscillator is comprised of:

a voltage-to-current converter coupled to said phase detector and to said integrator for generating an output current representative of an amount of voltage provided by said integrator and further representative of the first and second comparison signals provided by said phase detector; and a current-controlled oscillator, coupled to said voltage-to-current converter, for generating an output signal having a frequency representative of the output current of the voltage-to-current converter.

3. The damping circuit of claim 2 wherein said integrator comprises:

a capacitor for storing a charge, said capacitor being coupled to a ground; and a charge pump, having first and second inputs for receiving said first and second comparison signals from said phase detector, and having an output coupled to said capacitor, for varying the amount of charge stored in the capacitor by an amount proportional to the comparison signals received, with the output also coupled to the voltage-to-current converter.

4. The damping circuit of claim 3 wherein the damping circuit is a part of an integrated circuit.

5. The damping circuit of claim 4 wherein said integrated circuit is a microprocessor circuit.

6. The damping circuit of claim 3 wherein said first comparison signal output from said phase detector is a pulse having a duration representative of the amount by which the phase of the first input signal received by the phase detector exceeds the phase of the second input signal received by the phase detector and wherein said second comparison signal is a pulse having a duration representative of the amount by which the phase of the second input signal exceeds the phase of the first input signal.

7. The damping circuit of claim 2 wherein said voltage-to-current converter comprises:

a first current source having a control line coupled to said output of said integrator and an output coupled to an output line;

a second current source having an output;

a first switch connected in series with said second current source and having a control line responsive to said first comparison signal from said phase-and-frequency detector to connect said second current source to said output line, the output of said second current source being responsive to said first switch;

a third current source having an output;

an inverter coupled to said phase-and-frequency detector for receiving and inverting said second comparison signal; and a second switch connected in series with said third current source and having a control line coupled to an output of said inverter and responsive to the inverted said second comparison signal from said phase-and-frequency detector to connect said second current source to said output line, the output of said third current source being responsive to said second switch.

8. The damping circuit of claim 7 wherein said second and third current sources are voltage controlled current sources controlled by the same voltage as said first voltage controlled current source.

9. The damping circuit of claim 7 wherein said second and third current sources are voltage controlled current sources for providing a current proportional to the current in the output line.

10. An integrated circuit comprising:

microprocessor circuitry having a phase locked loop for providing at least one clock signal to said microprocessor circuitry, said phase locked loop having:

a phase detector for receiving first and second input signals and for generating a first comparison signal representative of an amount by which a phase of the first input signal exceeds a phase of the second input signal and a second comparison signal representative of an amount by which the phase of the second input signal exceeds the phase of the first input signal;

an integrator coupled to said phase detector for combining said first and second comparison signals and for generating a third comparison signal representative of a cumulative sum of said first and second comparison signals;

an oscillator coupled to said phase detector and said integrator for generating an output signal having a frequency responsive to the combination of said first, second and third comparison signals;

circuitry responsive to said output of said oscillator for providing at least one clock signal to said microprocessor circuitry;

feed back circuitry for feeding a signal responsive to the output of said oscillator back to said phase detector as said second input signal.

11. The integrated circuit of claim 10 wherein said oscillator is comprised of:

a voltage-to-current converter coupled to said phase detector and to said integrator for generating an output current representative of an amount of voltage provided by said integrator and further representative of the first and second comparison signals provided by said phase detector; and a current-controlled oscillator, coupled to said voltage-to-current converter, for generating an output signal having a frequency representative of the output current of the voltage-to-current converter.

12. The integrated circuit of claim 11 wherein said integrator comprises:

a capacitor for storing a charge, said capacitor being coupled to a ground; and a charge pump, having first and second inputs for receiving said first and second comparison signals from said phase detector, and having an output coupled to said capacitor, for varying the amount of charge stored in the capacitor by an amount proportional to the comparison signals received, with the output also coupled to the voltage-to-current converter.

13. A method of providing a damping signal comprising the steps of:

receiving a first input signal having a first phase and a second input signal having a second phase;

generating a first comparison signal representative of an amount by which a phase of the first input signal exceeds a phase of the second input signal and generating a second comparison signal representative of an amount by which aphase of the second signal exceeds the phase of the first input signal;

combining said first and second comparison signals;

generating a current signal by combining the first and second comparison signals and the cumulative sum of the first and second comparison signals; and generating an output signal having a frequency representative of the current signal.

14. The method of claim 13, wherein said step of combining said first and second comparison signals comprises the steps of:

storing a charge in a capacitor; and varying the amount of charge stored in the capacitor by an amount proportional to the comparison signals.

15. The method of claim 14, wherein said step of generating the first and second comparison signals comprises the steps of:

generating a first pulse having a duration representative of the amount by which the phase of the first input signal exceeds the phase of the second input signal; and generating a second pulse having a duration representative of the amount by which the phase of the second input signal exceeds the phase of the first input signal.

16. The method of claim 14, wherein said step of varying said charge within said capacitor comprises the step of passing said first and second comparison signals through a charge pump operably coupled to said capacitor, said charge pump increasing said charge in response to said first comparison signal and decreasing said charge in response to said second comparison signal.

17. The method of claim 14, wherein said step of generating a current signal comprises the step of:

passing said first and second comparison signals and a voltage signal representative of a voltage on said capacitor through a voltage-to-current converter.

18. The method of claim 13, wherein said step of generating an output signal having a frequency representative of the current signal comprises the step of:

passing said current signal through a current-controlled oscillator.

19. A method comprising the steps of:

providing a phase detector for receiving first and second input signals and for generating a first comparison signal representative of an amount by which a phase of the first signal exceeds a phase of the second input signal and a second comparison signal representative of an amount by which the phase of the second input signal exceeds the phase of the second input signal, said first input signal being a reference signal and said second input signal being a feedback signal;

providing an integrator for combining said first and second comparison signals and for generating a third comparison signal representative of a combination of said first and second comparison signals;

providing an oscillator coupled to said phase detector and said integrator for generating an output signal having a frequency responsive to the combination of said first, second and third comparison signals, said output signal being coupled to provide said feedback signal.

20. The method of claim 19, wherein said step of providing an integrator comprises the steps of:

providing a capacitor for storing a charge, said capacitor coupled to a ground; and providing a charge pump, having first and second inputs for receiving said first and second comparison signals from said phase detector, and having an output coupled to said capacitor, for varying the amount of charge stored in the capacitor by an amount proportional to the comparison signal received, with the output also coupled to the voltage-to-current converter.

21. The method of claim 20, wherein said first comparison signal output from said phase detector is a pulse having a duration representative of the amount by which the phase of the first input signal received by the phase detector exceeds the phase of the second input signal received by the phase detector and wherein said second comparison signal is a pulse having a duration representative of the amount by which the phase of the second input signal exceeds the phase of the first input signal.

22. The method of claim 21, wherein, while said first comparison signal from said phase detector is active, said charge pump adds charge to said capacitor by an amount proportional to the duration of the first comparison signal and, while said second comparison signal from said phase detector is active, said charge pump withdraws charge from said capacitor by an amount proportional to the duration of the second comparison signal.

23. The method of claim 19 wherein the step of providing an oscillator comprises:

providing a voltage-to-current converter, coupled to said phase detector and to said integrator for generating an output current representative of an amount of voltage provided by said integrator and further representative of the first and second comparison signals provided by said phase detector; and providing a current-controlled oscillator, coupled to said voltage-to-current converter generating an output signal having a frequency representative of the output current of the voltage-to-current converter.

24. The method of claim 23 wherein said step of providing a voltage-to-current converter comprises the steps of:

providing a first voltage controlled current source having a control line coupled to said output of said integrator, an input coupled to a ground and an output coupled to an output line;

providing a second voltage controlled current source having a control line coupled to said output of said integrator, and input coupled to said ground and an output;

providing a first switch having a control line for receiving said first comparison sign from said phase-and-frequency detector, an input coupled to the output of said second current source, and an output coupled to said output line;

providing a third voltage controlled current source having a control line coupled to said output of said integrator, and input coupled to said ground, and an output;

providing an inverter coupled to said phase-and-frequency detector for receiving and inverting said second comparison signal; and providing a second switch having a control line coupled to an output of said inverter, an input coupled to said output of said third voltage controlled current source and an output coupled to said output line.

* * * * *